United States Patent
Kang

[11] Patent Number: 5,883,438
[45] Date of Patent: Mar. 16, 1999

[54] INTERCONNECTION STRUCTURE FOR ATTACHING A SEMICONDUCTOR TO SUBSTRATE

[75] Inventor: Dae Soon Kang, Choongchungbook-Do, Rep. of Korea

[73] Assignee: LG Semicon Co., Ltd., Cheongju, Rep. of Korea

[21] Appl. No.: 854,069

[22] Filed: May 8, 1997

Related U.S. Application Data

[63] Continuation of Ser. No. 587,744, Jan. 19, 1996, Pat. No. 5,703,406.

[30] Foreign Application Priority Data

Sep. 22, 1995 [KR] Rep. of Korea .................. 31431/1995

[51] Int. Cl.⁶ .................................................. H01L 23/48
[52] U.S. Cl. .......................................... 257/778; 257/738
[58] Field of Search .................................. 257/737, 738, 257/739, 778, 779, 780

[56] References Cited

U.S. PATENT DOCUMENTS 5,111,279  5/1992  Pasch et al. .

FOREIGN PATENT DOCUMENTS 3-48435   3/1991  Japan .
4-273464  9/1992  Japan .

OTHER PUBLICATIONS

"Apparatus for Solder Ball Alignment and Containment", IBM Technical Disclosure Bulletin, vol. 38 No. 12, Dec. 1995.

Primary Examiner—Peter Toby Brown
Assistant Examiner—Roy Potter
Attorney, Agent, or Firm—Fleshner & Kim

[57] ABSTRACT

An interconnection structure for bonding a semiconductor device on a substrate includes a semiconductor chip having a plurality of solder balls attached thereto; and an under-fill substance layer being adjacently bonded to the semiconductor chip and having a plurality of holes therein. By employing the structure, when the semiconductor chip and the substrate are electrically bonded, a previously provided under fill substance layer is used without any additional under filling step, so that the entire process can be simplified and its reliability can be improved.

11 Claims, 3 Drawing Sheets

5,883,438

INTERCONNECTION STRUCTURE FOR ATTACHING A SEMICONDUCTOR TO SUBSTRATE

This application is a continuation of application Ser. No. 08/587,744 filed Jan. 19, 1996 now U.S. Pat. No. 5,703,406.

BACKGROUND OF THE INVENTION

1. Field of the Invention

The present invention relates to an interconnection structure for bonding a semiconductor device to a substrate, and more particularly to an interconnection structure for simultaneously performing under-filling in bonding the semiconductor device to a supporting board or to the substrate.

2. Description of the Prior Art

A conventional interconnection structure for bonding a semiconductor device to a substrate is known as shown in FIGS. 1A and 1B. Reference numeral 1 denotes a semiconductor chip which is provided with a plurality of solder balls 2 at the lower part thereof. The plurality of solder balls may be substituted by solder bumps. An under-fill region 4 is formed at an outer circumferential surface of the solder balls 2 formed between the semiconductor chip 1 and a printed circuit board 3.

In the semiconductor device having such a construction, the semiconductor chip 1 is bonded on the printed circuit board 3 by heating or by pressing. Thereafter, an epoxy molding compound (not shown) is injected to the under-fill region 4 by using a nozzle 7 as shown in FIG. 1B. Then, the epoxy molding compound flows into the under-fill region 4 to perform under filling, thereby completing a flip chip package or a chip scale package.

However, for the purpose of bonding the semiconductor device, since the interconnection structure as constructed above adapts a method of injecting the epoxy molding compound between the semiconductor chip and the printed circuit board, forcibly or by using a force of gravity, the following problems may arise.

First, since any air bubbles included in the substance injected between the semiconductor chip and the printed circuit board are not easily removed, cracks may occur in the under-fill substance and solder balls(bumps).

Secondly, since the substance injected between the semiconductor chip and the printed circuit board does not constantly maintain its bonding force, a reliability of the product is degraded, and a short circuit may occur.

Thirdly, because a step for under filing must be additionally performed, the entire process is complicated, causing an increase in production cost and a decrease in productivity.

SUMMARY OF THE INVENTION

Therefore, an object of the present invention is to provide an improved interconnection structure for reliably bonding a semiconductor device on a substrate which overcomes the above-mentioned problems.

Another object of the present invention is to provide an interconnection structure for bonding a semiconductor device on a substrate capable of increasing an interfacial bonding force between the semiconductor device and a printed circuit board by depositing and pressing an under-fill substance.

In order to attain the above objects, there is provided an interconntection structure including a semiconductor chip having a plurality of solder balls attached thereto; and an under-fill substance layer having a plurality of holes therein.

DETAILED DESCRIPTION OF THE INVENTION

A preferred embodiment of the present invention will now be described with reference to the accompanying drawings.

Figure 1A:
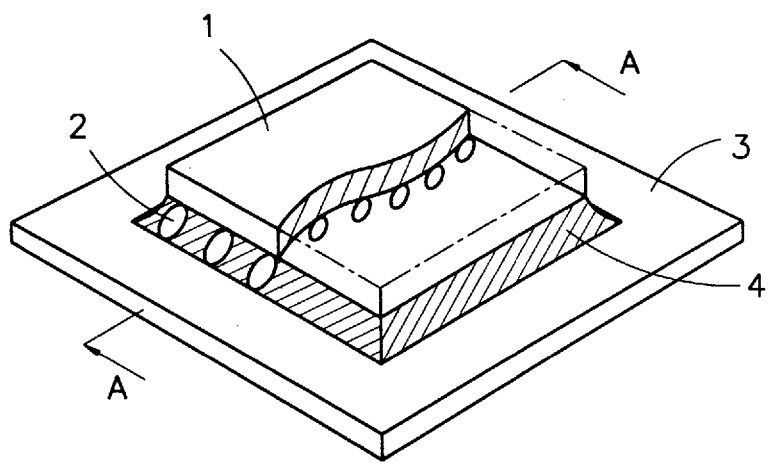
FIG. 1A is a schematic perspective view of a conventional flip chip package.
Figure 1B:
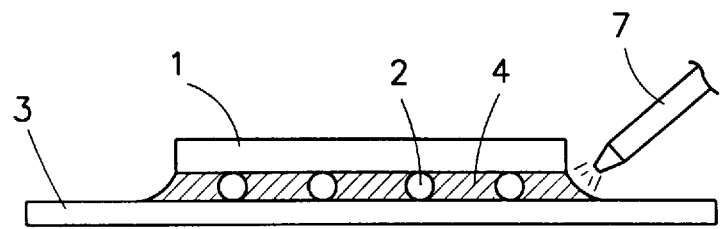
FIG. 1B is a cross-sectional view taken along, line A—A of FIG. 1A.
Figure 2A:
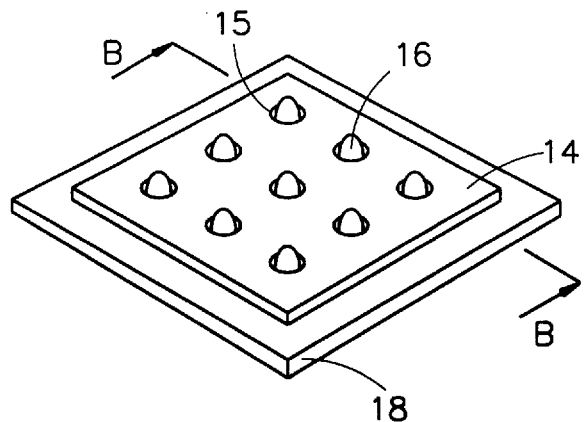
FIG. 2A is a perspective view of an interconnection structure in accordance with one embodiment of the present invention.

FIG. 2A is a perspective view of an interconnection structure in accordance with an embodiment of the present invention. As shown in this figure, a planarized under-fill substance layer 14 is attached to a semiconductor chip 18 having a plurality of solder balls 16 (referring to FIG. 2C).

Figure 2B:
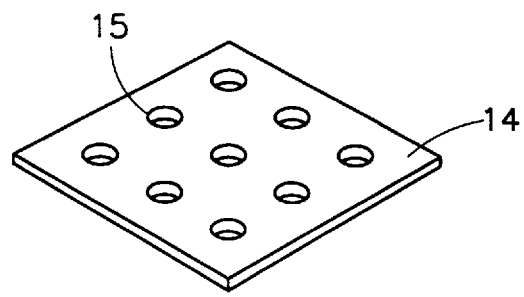
FIG. 2B is a perspective view of an under-fill substance layer in accordance with the present invention.

Referring to FIG. 2B, the under-fill substance layer 14 has a square form, in which a plurality of holes 15 are formed at regular intervals in a matrix arrangement. The form and structure of the holes 15 can be varied depending on the form and the structure of the solder balls 16 (to be described later), and for which an oval type is preferable as shown in FIG. 2B.

Figure 2C:
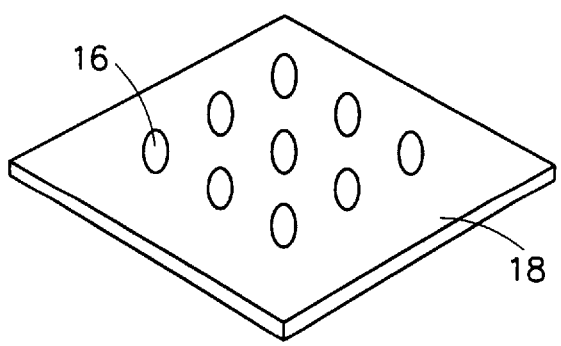
FIG. 2C is a perspective view of a semiconductor chip adapted in accordance with the present invention.

FIG. 2C is a perspective view of the semiconductor chip. The semiconductor chip 18 adapted to the present invention is provided with the plurality of solder balls 16 likewise as in a BGA (Ball Grid Array) package. The plurality of solder balls 16 and the holes 15 are formed to be correspondingly inserted accommodated with each other. Thus, on an upper surface of the printed circuit board 13, an under-fill substance layer 14 is formed and then the semiconductor chip 18 is mounted.

Figure 3:
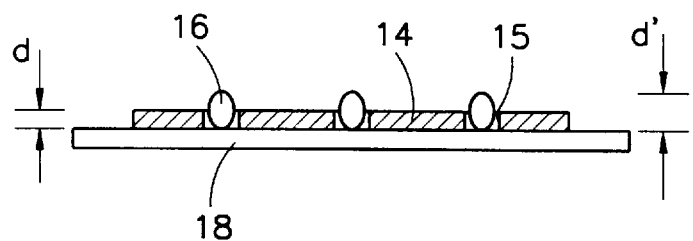
FIG. 3 is a cross-sectional view taken along line B—B of FIG. 2A.

FIG. 3 is a cross-sectional view taken along line B—B of FIG. 2A. As shown in FIG. 3, the under-fill substance layer 14 is so tightly joined to the semiconductor chip 18 (referring to FIGS. 4A and 4B) as to be formed in one body therewith. In this respect, it is preferable that the height "d" of the under-fill substance layer 14 is lower than the height "d" of the solder ball 16.

Figure 4A:
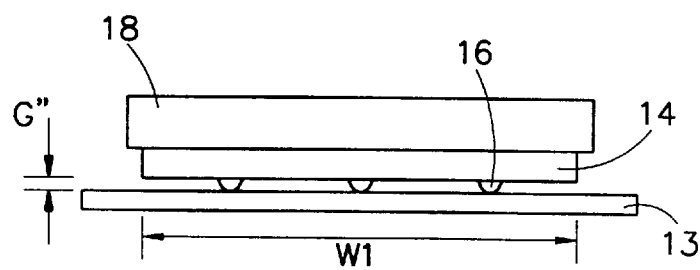
FIG. 4A is a cross-sectional view showing a pressing, step of the under-fill substance layer.

FIG. 4A is a cross-sectional view showing a pressing step of the under-fill substance layer. As shown in this figure, the semiconductor chip 18 having the solder balls 16 is positioned on the printed circuit board 13, and thereafter, a bonding step is performed by applying heating and pressure. At this time, the solder balls 16 are first compressed by as much as a predetermined distance "G", and subsequently the under-fill substance layer 14 is compressed by a compressing means (not shown). In this respect, when the under-fill substance layer 14 is compressed it is enlarged in width from W1 to W2 (referring to FIG. 4B) in the horizontal direction.

Figure 4B:
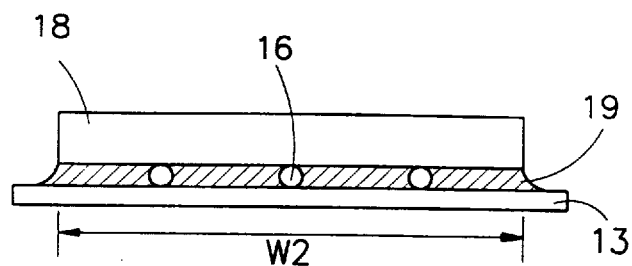
FIG. 4B is a cross-sectional view of a completed flip chip package.

FIG. 4B is a cross-sectional view of a completed flip chip package. As shown in this figure, an under-fill region 19 is formed as the under-fill substance layer 14 (referring to FIG. 4A) is compressed. The under-fill region 19 connects the semiconductor chip 18 to the printed circuit board 13 without having any influence on the solder balls 16. That is, with the interconnection structure of the present invention, the solder balls 16 are bonded by a single step, and the under-fill substance layer 14 is compressed by the compressing means, so that the semiconductor chip 18 is favorably bonded to the printed circuit board.

As so far described, according to the interconnection structure of the present invention, when the solder balls or metal bumps placed on the semiconductor chip are bonded on the substrate, the under filling is simultaneously performed, so that manufacturing process is simplified and its productivity can be improved. Also, in a wafer process, the under-fill substance is compressed after being deposited, so that an interfacial bonding force between the semiconductor chip and the printed circuit board is increased while any void between them is removed, thereby improving reliability.

What is claimed is:

1. An interconnection structure of a semiconductor device on a substrate, comprising:

a semiconductor chip having a plurality of solder balls attached thereto; and an under-fill substance layer interposed between the semiconductor chip and the substrate and having a plurality of holes therein, each of the holes accommodating a corresponding one of the plurality of solder balls of the semiconductor chip, and said semiconductor chip being in contact with said under-fill substance layer, wherein a diameter of each of said plurality of holes is substantially the same as corresponding one of said plurality of solder balls such that said plurality of solder balls fits into said plurality of holes.

2. The interconnection structure according to claim 1, wherein said plurality of solder balls are formed at regular intervals in a matrix arrangement.

3. The interconnection structure according to claim 1, wherein said semiconductor chip has first and second surfaces opposed to one another, and said under-fill substance layer has first and second surfaces opposed to one another, said first surfaces of said semiconductor chip and under-fill substance layer being in contact with each other.

4. The interconnection structure of claim 1, wherein a height of the under-filled substance layer is lower than that of the solder balls.

5. The interconnection structure according to claim 3, wherein entire surfaces of said first surfaces of said semiconductor chip and said under-fill substance layer are in contact.

6. A semiconductor device comprising:

a semiconductor chip having first and second surfaces;

a plurality of conductive media having first and second ends, and said first ends of said plurality of conductive media being attached to said first surface of said semiconductor chip; and an interconnection member having first and second surfaces, said interconnection member having a plurality of holes which extend from said first surface to said second surface, wherein said plurality of conductive media is inserted through said plurality of holes from said first surface to said second surface of said interconnection member such that said second ends of said plurality of conductive media extends beyond said second surface of the interconnection member and wherein a diameter of each of said plurality of holes is substantially the same as corresponding one of said plurality of conductive media such that said plurality of conductive media fits into said plurality of holes.

7. The semiconductor device of claim 6, wherein said plurality of conductive media is at least one of a plurality of solder balls and bumps.

8. The semiconductor device of claim 6, wherein said interconnection member is an under-fill substance layer.

9. The semiconductor device of claim 6, wherein said interconnection member has a thickness which is smaller than a height of said plurality of conductive media.

10. The semiconductor device of claim 6, wherein said interconnection member has a width which is smaller than that of the semiconductor chip.

11. The semiconductor device of claim 6, wherein said first surface of said interconnection member contacts said first surface of said semiconductor chip.

* * * * *